United States Patent
Kim

(10) Patent No.: US 10,517,173 B2
(45) Date of Patent: Dec. 24, 2019

(54) DISPLAY DEVICE HAVING DISPLAY PANEL AND BACK COVER

(71) Applicant: LG Display Co., Ltd., Seoul (KR)

(72) Inventor: Jae-Ho Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/825,491

(22) Filed: Nov. 29, 2017

(65) Prior Publication Data

US 2018/0153038 A1 May 31, 2018

(30) Foreign Application Priority Data

Nov. 30, 2016 (KR) .......................... 10-2016-0162335

(51) Int. Cl.
*H05K 1/14* (2006.01)
*H05K 1/02* (2006.01)
(Continued)

(52) U.S. Cl.
CPC .......... *H05K 1/14* (2013.01); *G02F 1/133308* (2013.01); *H05K 1/028* (2013.01); *H05K 1/11* (2013.01); *H05K 5/0017* (2013.01); *H05K 5/03* (2013.01); *H05K 7/20436* (2013.01); *H05K 7/20963* (2013.01); *G02F 2001/133314* (2013.01); *H05K 2201/10128* (2013.01)

(58) Field of Classification Search
CPC .......... H05K 1/14; H05K 1/028; H05K 5/0017
See application file for complete search history.

(56) References Cited

U.S. PATENT DOCUMENTS 7,880,829 B2 * 2/2011 Park .................... G02F 1/13452
248/917
9,622,391 B2 * 4/2017 Lee ..................... G02F 1/13452
(Continued)

FOREIGN PATENT DOCUMENTS

CN 1713248 A 12/2005
CN 101389204 A 3/2009
(Continued)

OTHER PUBLICATIONS

Chinese Office Action dated Jul. 17, 2019 issued in corresponding application No. 201710822397.6 (7 pages) and English language translation (9 pages).

*Primary Examiner* — William H. Mayo, III
*Assistant Examiner* — Hiram E Gonzalez
(74) *Attorney, Agent, or Firm* — Polsinelli PC

(57) ABSTRACT

A display panel includes a first substrate and a second substrate; a source printed circuit board on the second substrate of the display panel, the source printed circuit board electrically connected to the display panel; a control printed circuit board electrically connected to the source printed circuit board by a signal cable; and a back cover accommodating the display panel including the first and second substrates and the source printed circuit board, and disposed between the source printed circuit board and the control printed circuit board, the back cover including a penetrating hole, through which the signal cable passes and maintaining a space by the signal cable with respect to the display panel, wherein the penetrating hole of the back cover is disposed at a mid-portion of the second substrate in a vertical direction.

19 Claims, 5 Drawing Sheets

(51) Int. Cl.
   *H05K 1/11*   (2006.01)
   *H05K 5/00*   (2006.01)
   *H05K 5/03*   (2006.01)
   *H05K 7/20*   (2006.01)
   *G02F 1/1333* (2006.01)

(56) References Cited

U.S. PATENT DOCUMENTS

| | | | |
|---|---|---|---|
| 2005/0286228 A1 | 12/2005 | Kim | |
| 2006/0139271 A1* | 6/2006 | Okuda | G02F 1/133308 345/88 |
| 2009/0201438 A1* | 8/2009 | Kim | H01L 27/3276 349/58 |
| 2014/0240933 A1* | 8/2014 | Lee | G06F 1/1656 361/749 |
| 2017/0045678 A1* | 2/2017 | Hsu | G02B 6/0088 |

FOREIGN PATENT DOCUMENTS

| | | |
|---|---|---|
| CN | 104021734 A | 9/2014 |
| CN | 105991948 A | 10/2016 |

* cited by examiner

DISPLAY DEVICE HAVING DISPLAY PANEL AND BACK COVER

CROSS-REFERENCE TO RELATED APPLICATION

This application claims the benefit of Korean Patent Application No. 10-2016-0162335, filed on Nov. 30, 2016, which is hereby incorporated by reference in its entirety as if fully set forth herein.

BACKGROUND

Field of the Disclosure

The present disclosure relates to a display device, and more particularly, to a display device including a back cover for receiving a display panel.

Discussion of the Background

In general, electronic appliances, such as monitors, a TV, a laptop computer, and a digital camera, which include a display device to realize an image. For example, the display device may include a liquid crystal display device and an organic light-emitting display device.

The display device may include a display panel for substantially realizing an image and printed circuit boards electrically connected to the display panel. For example, the display device may include a source printed circuit board (S-PCB) connected to the display panel, and a control printed circuit board (C-PCB) connected to the S-PCB.

The display device may include a back cover in order to prevent the display panel from being damaged due to external impact. In order to prevent deformation of the display panel by the shape of the back cover, and distortion of the image realized by the display panel, the display device may include an air gap between the surface on which the image of the display panel is not displayed and the back cover.

However, when the display device is inclined, for example, when the display device is installed on a wall to be inclined downward, a center region of the display panel is relatively distant from the back cover. Thus, the heat emission efficiency of the display device may deteriorate in the center region of the display panel. Therefore, the display device has a problem in that an afterimage may be generated in the center region of the display panel due to residual heat.

SUMMARY OF THE DISCLOSURE

Accordingly, the present disclosure is directed to a display device including a display panel and a back cover that substantially obviates one or more problems due to limitations and disadvantages of the related art.

The present disclosure is to provide a display device capable of maintaining a predetermined air gap between a display panel and a back cover regardless of an installation state thereof.

The present disclosure is to provide a display device capable of improving heat emission efficiency of a display panel.

Additional advantages and features of the disclosure will be set forth in part in the description which follows and in part will become apparent to those having ordinary skill in the art upon examination of the following or may be learned from practice of the disclosure. Additional advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display device including a display panel. The display panel includes a first substrate and a second substrate. The size of the second substrate is smaller than that of the first substrate. A source printed circuit board is disposed on the second substrate of the display panel. The source printed circuit board is connected to the display panel. A control printed circuit board is disposed on the second substrate of the display panel. The control printed circuit board is connected to the source printed circuit board by a signal cable. A back cover is disposed between the source printed circuit board and the control printed circuit board. The back cover includes a penetrating hole. The signal cable passes through the penetrating hole. The penetrating hole of the back cover is disposed near a center region in a vertical direction of the second substrate.

In another aspect of the present disclosure, a display device includes a display panel having first and second substrates; a back cover surrounding the display panel and having a through-hole; a source printed circuit board disposed inside the back cover; a control printed circuit board outside disposed the back cover and connected to the source printed circuit board by the through-hole; an air gap between the display panel and the back cover; and a first fastener disposed between the display panel and the back cover and maintaining the air gap.

The source printed circuit board and the control printed circuit board may be located near a lower end of the second substrate.

An inner fixing tape may be located between the display panel and the back cover. The inner fixing tape may be spaced apart from the back cover. The signal cable may extend between the display panel and the inner fixing tape.

The inner fixing tape may be located near the penetrating hole of the back cover.

The inner fixing tape may include a heat radiation material.

The inner fixing tape may extend along the signal cable between the display panel and the back cover.

An outer fixing tape may be located on an outer surface of the back cover. The signal cable may extend between the back cover and the outer fixing tape.

The outer fixing tape may be located near the penetrating hole of the back cover.

The outer fixing tape may include the same material as the inner fixing tape.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION OF THE DISCLOSURE

Figure 1:
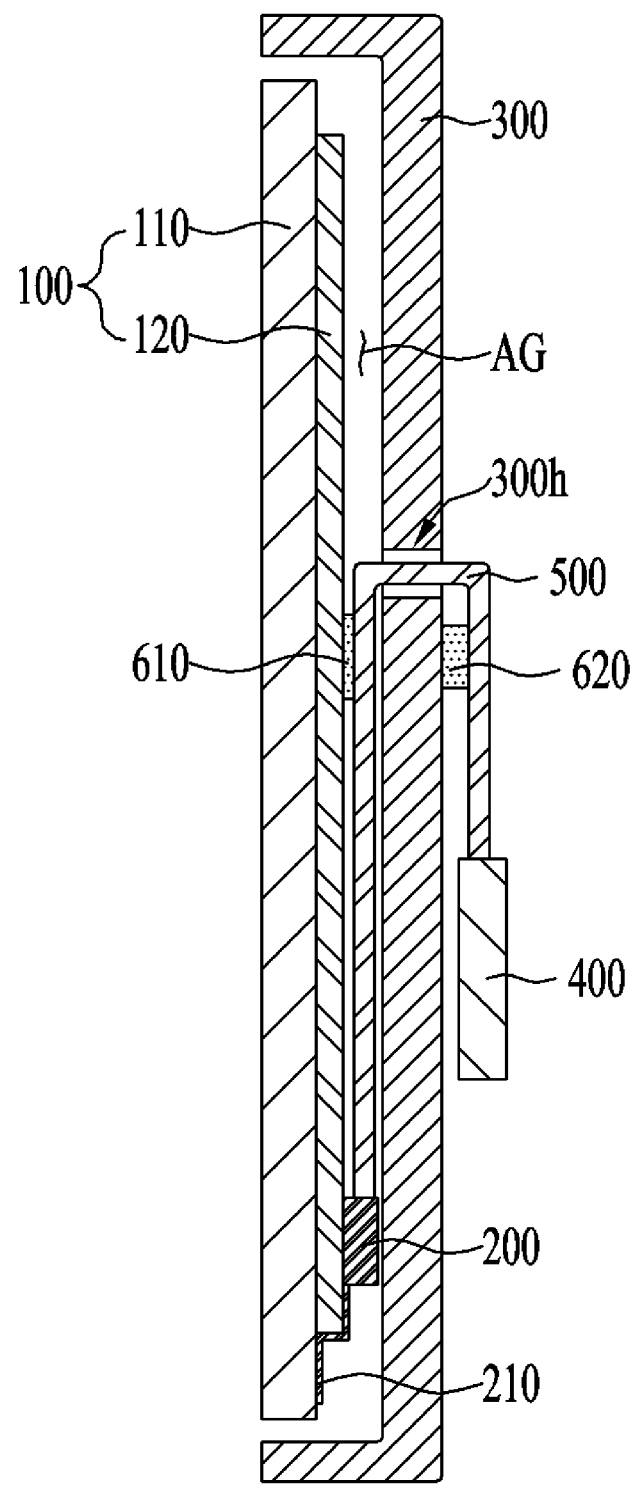
FIG. 1 is a view schematically showing a side surface of a display device according to an aspect of the present disclosure.

The configurations and advantages of the present disclosure will become apparent with reference to aspects described below in detail in conjunction with the accompanying drawings. Here, since the aspects of the present disclosure are provided to sufficiently deliver the technical spirit of the present disclosure to those skilled in the art, the present disclosure may be implemented in another format without being limited to the aspects disclosed hereinafter.

Throughout the present specification, the same reference numerals designate the same constituent elements. In the drawings, the length and thickness of a layer or region may be exaggerated for convenience. In addition, if a first element is located "on" or "above" a second element, the first element may directly contact the second element or a third element may be provided between the first element and the second element.

Since terms such as "first" and "second" may be used to describe various elements, these terms are merely used to distinguish one element from another element. The first element and the second element may be arbitrarily used for convenience of understanding by those skilled in the art without departing from the technical spirit of the present disclosure.

Terms used in this specification are used merely to illustrate specific aspects and are not intended to limit the present disclosure. For example, a singular representation may include a plural representation unless context clearly indicates otherwise. It will be understood that the terms "including", "having", etc., used in this specification specify the presence of features, numerals, steps, operations, elements or parts described in this specification or a combination thereof and do not exclude presence or addition of one or more additional features, numerals, steps, operations, elements, parts or combinations thereof.

So long as not defined otherwise, all terms used herein including technical terms and scientific terms may have the same meaning as generally understood by an ordinary person skilled in the art to which the present disclosure pertains. In addition, general terms used in the description of the present disclosure should be construed according to definitions in dictionaries or according to context, and should not be construed in an excessively restrained manner unless defined clearly in this specification.

Example

Figure 2:
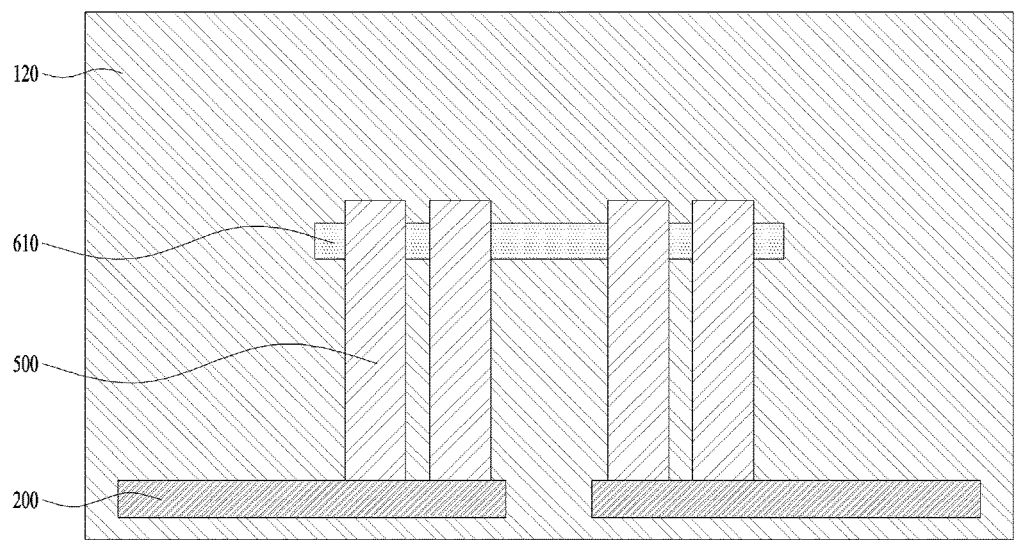
FIG. 2 is a view showing the display device of FIG. 1 when viewed from the outside of a second substrate of a display panel.
Figure 3:
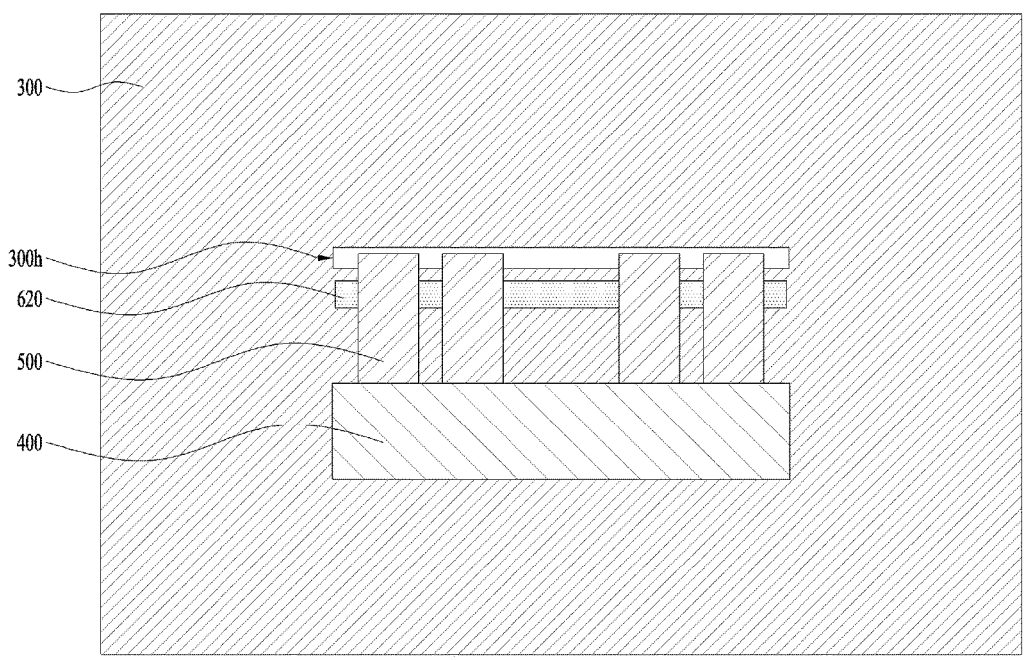
FIG. 3 is a view showing the display device of FIG. 1 when viewed from the outside of a back cover.

FIG. 1 is a view schematically showing a side surface of a display device according to an aspect of the present disclosure. FIG. 2 is a view showing the display device of FIG. 1 when viewed from the outside of a second substrate of a display panel. FIG. 3 is a view showing the display device of FIG. 1 when viewed from the outside of a back cover.

Collectively referring to FIGS. 1 to 3, the display device according to the aspect of the present disclosure may include a display panel 100. The display panel 100 may substantially realize an image. For example, the display panel 100 may include a plurality of pixel regions. A light emitting element or a permeability changing element may be located in each pixel region. For example, the display device according to the aspect of the present disclosure may be an organic light emitting display device in which an organic light emitting element including an organic light emitting layer can be disposed in each pixel of the display panel 100.

The display panel 100 may include a first substrate 110 and a second substrate 120 attached to the first substrate 110. The size of the second substrate 120 may be smaller than that of the first substrate 110. Electrical elements for controlling the pixel regions and/or pads electrically connected to the electrical elements may be disposed on a region of the first substrate 110 exposed by the second substrate 120. For example, the display panel 100 may output a specific image to the outside of the first substrate 110.

The pads may be disposed on the region of the first substrate 110 exposed by the second substrate 120. The pads may be connected to a scan driver and/or a data driver. The scan driver may be connected to a display region through gate lines. The display region may be disposed on a region of the first substrate 110 overlapping the second substrate 120. The data driver may supply data signals through data lines. The data lines may intersect the gate lines.

The data driver may include a plurality of source drive ICs. Each source drive IC may convert digital video data into a gamma voltage and generate data signals. The data driver may be disposed outside the display panel 100. For example, the data driver may be connected to the data lines located on the display panel 100 by a chip on glass (COF) or tape automated bonding (TAB) method.

The source drive ICs of the data driver may be bonded to a source printed circuit board 200 connected to the display panel 100 through a flexible film 210. The source printed circuit board 200 may be disposed on the outer surface of the second substrate 120 of the display panel 100. The flexible film 210 may extend along the side surface of the second substrate 120.

The scan driver may sequentially supply scan signals to the display region of the display panel 100. For example, the scan driver may include a level shifter and a shift register. The scan driver may be mounted on the region of the first substrate 110 exposed by the second substrate 120. For example, the display device according to the aspect of the present disclosure may include an integrated scan driver such as a gate in panel (GIP) scan driver.

The display device according to the aspect of the present disclosure may further include a timing controller. The timing controller may generate and supply timing control signals for controlling operation timings of the gate driver and the data driver.

The timing controller may be located outside the display panel 100. For example, the timing controller may be bonded to a control printed circuit board 400. The source printed circuit board 200 may be connected to the control printed circuit board 400 through a signal cable 500 such as a flexible flat cable (FFC) or a flexible printed circuit (FPC).

The display device according to the aspect of the present disclosure may further include a back cover 300 in order to prevent the display panel 100 from being damaged due to external impact. The back cover 300 may be disposed on the outer surface of the second substrate 120 of the display panel 100. The back cover 300 may be spaced apart from the outer surface of the second substrate 120 of the display panel 100. For example, an air gap AG may be disposed between the outer surface of the second substrate 120 of the display panel 100 and the back cover 300. Thus, in the display device according to the aspect of the present disclosure, deformation of the display panel 100 and distortion of an image implemented by the display panel can be prevented due to the shape of the back cover 300.

The source printed circuit board 200 may be disposed between the display panel 100 and the back cover 300. The control printed circuit board 400 may be disposed on the outer surface of the back cover 300. The signal cable 500 connecting between the source printed circuit board 200 and the control printed circuit board 400 may penetrate the back cover 300. For example, the back cover 300 may include a penetrating hole 300h, through which the signal cable 500 passes.

The penetrating hole 300h of the back cover 300 may be disposed near a center region of the display panel 200. For example, the penetrating hole 300h of the back cover 300 may be disposed near the center region in the vertical direction of the second substrate 120. The center region in the vertical direction of the second substrate 120 may be a region including the central point of the second substrate 120. The source printed circuit board 200 and the control printed circuit board 400 may be disposed on the display panel 100 in the same direction. For example, as shown in FIGS. 1 to 3, the source printed circuit board 200 and the control printed circuit board 400 may be disposed near the lower end of the display panel 100.

In the display device according to the aspect of the present disclosure, the center region of the display panel 100 may be pulled toward the back cover 300, by the signal cable 500 connecting between the source printed circuit board 200 and the control printed circuit board 400 and passing through the penetrating hole 300h of the back cover 300 disposed near the center region of the display panel 100. When the display device according to the aspect of the present disclosure is obliquely installed, the center region of the display panel 100 can be prevented from being relatively far away from the back cover 300. That is, in the display device according to the aspect of the present disclosure, the air gap AG between the display panel 100 and the back cover 300 may be substantially maintained regardless of the state of installing the display panel 100. Accordingly, in the display device according to the aspect of the present disclosure, residual heat from being generated due to the state of installing the display panel can be prevented, so that an afterimage from being generated due to residual heat can also be prevented.

In the display device according to the aspect of the present disclosure, a first fastener such as an inner fixing tape 610 may be located between the display panel 100 and the signal cable 500. The signal cable 500 may be attached to the display panel 100 by the inner fixing tape 610. The inner fixing tape 610 may be located near the penetrating hole 300h of the back cover 300. In the display device according to the aspect of the present disclosure, a gap between the display panel 100 and the back cover 300 can be efficiently maintained due to the region of the display panel 100 attached to the signal cable 500 by the inner fixing tape 610.

In the display device according to the aspect of the present disclosure, a second fastener such as an outer fixing tape 620 may be located between the outer surface of the back cover 300 and the signal cable 500. The outer fixing tape 620 may fix the signal cable 500 passing through the penetrating hole 300h of the back cover 300 to the back cover 300. The outer fixing tape 620 may be located near the penetrating hole 300h of the back cover 300. For example, a position of the outer fixing tape 620 may be similar to that of the inner fixing tape 610. Therefore, in the display device according to the aspect of the present disclosure, the display panel 100 may be prevented from being excessively pulled toward the back cover 300 by the outer fixing tape 620.

The outer fixing tape 620 may include the same material as the inner fixing tape 610. That is, in the display device according to the aspect of the present disclosure, the signal cable 500 may be fixed with the same force inside and outside the penetrating hole 300h of the back cover 300. Therefore, in the display device according to the aspect of the present disclosure, the signal cable 500 may be prevented from being moved through the inner fixing cable 610 and the outer fixing tape 620. Accordingly, in the display device according to the aspect of the present disclosure, the air gap AG between the display panel 100 and the back cover 300 can be efficiently maintained and damage caused due to movement of the signal cable 500 can be prevented.

Figure 4:
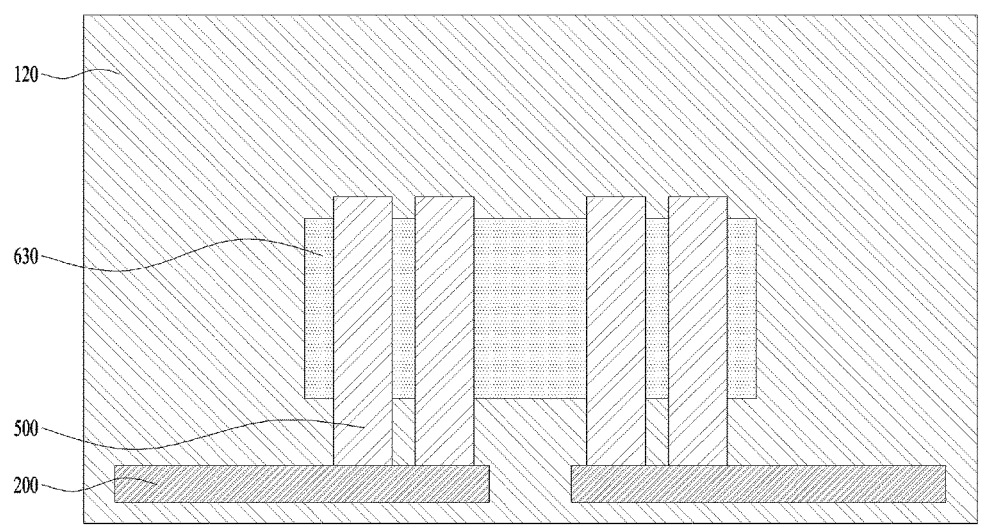
FIG. 4 is a view schematically showing a display device according to another aspect of the present disclosure.

The display device according to the aspect of the present disclosure is described that the inner fixing tape 610 only fixes the signal cable 500. However, in a display device according to another aspect of the present disclosure, the inner fixing tape 610 can dissipate heat from the display panel 100. For example, in the display device according to another aspect of the present disclosure, the inner fixing tape 610 may include a heat dissipation material. The inner fixing tape 630 including the heat dissipation material may extend along the signal cable 500 as shown in FIG. 4. In the display device according to another aspect of the present disclosure, the air gap AG between the display panel 100 and the back cover 300 can be maintained and heat dissipation efficiency can be improved.

Figure 5:
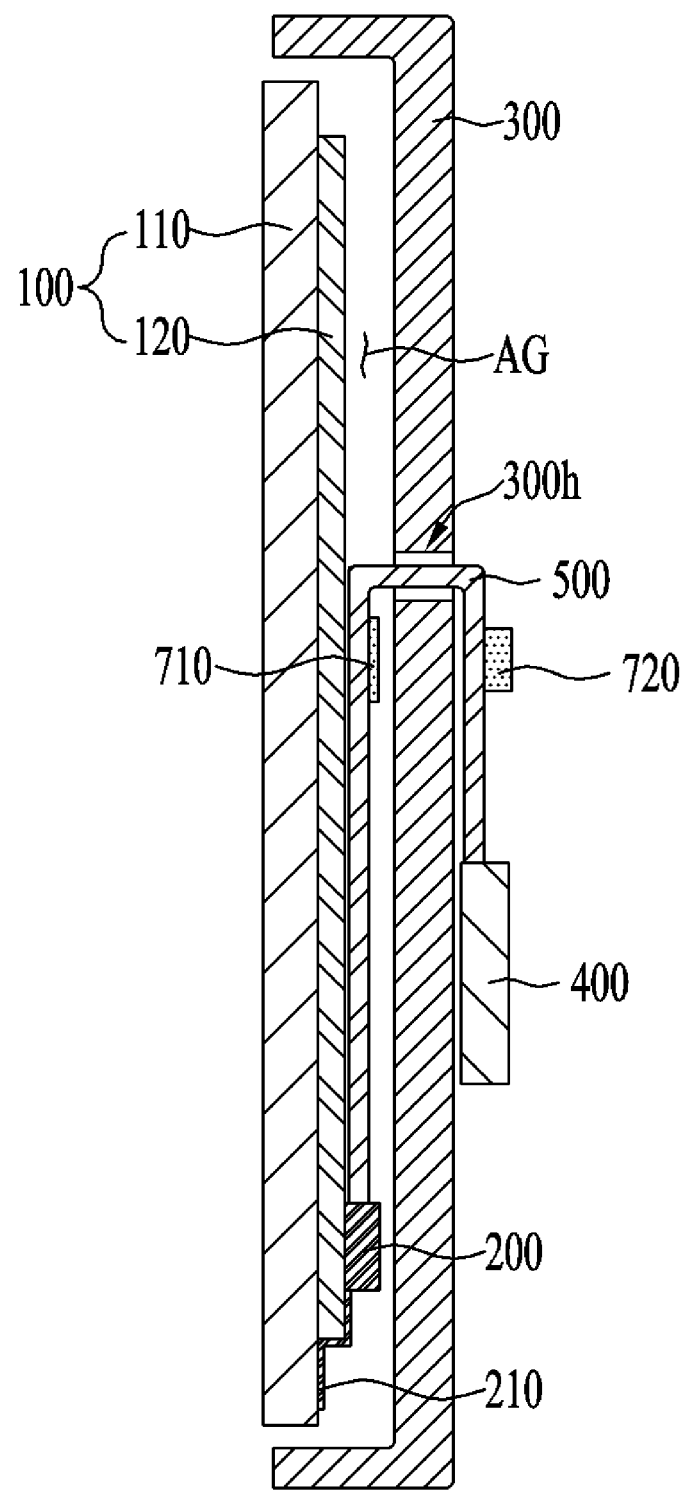
FIGS. 5 to 7 are views showing a display device according to another aspect of the present disclosure.
Figure 6:
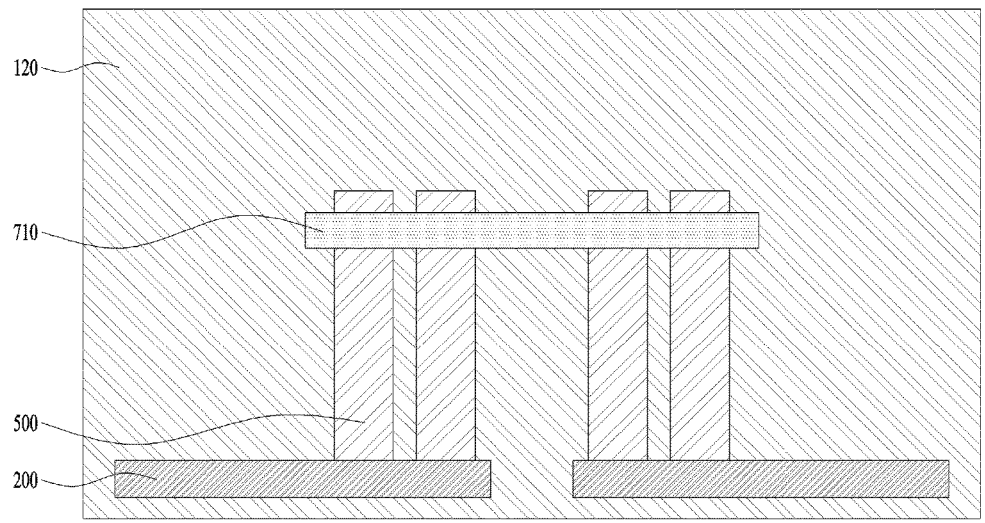
Figure 7:
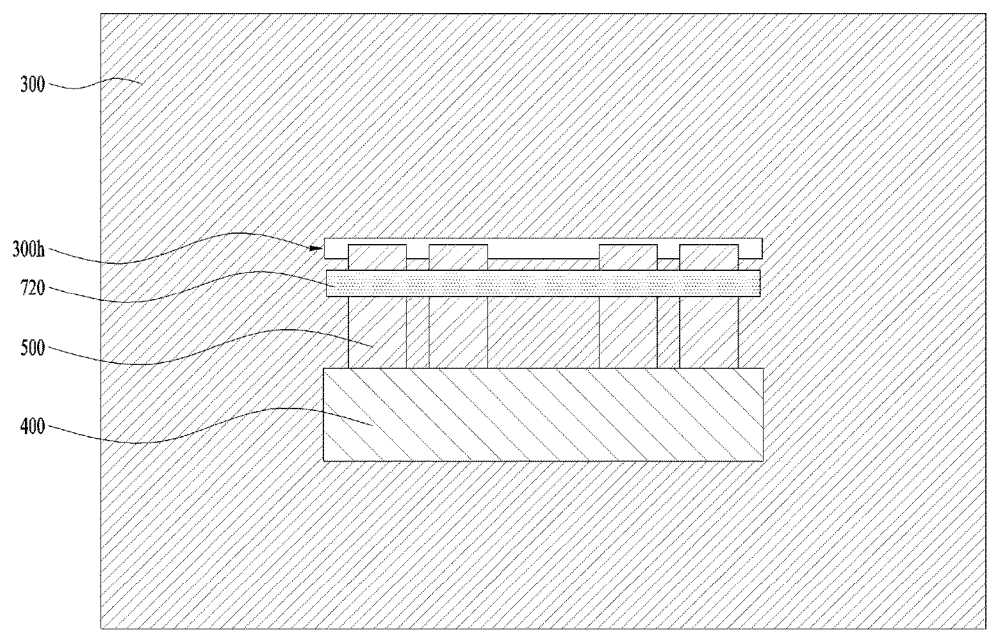

The display device according to the aspect of the present disclosure is described that the inner fixing tape 610 is located between the display panel 100 and the signal cable 500, and the outer fixing tape 620 is located between the outer surface of the back cover 300 and the signal cable 500. However, as shown in FIGS. 5 to 7, a display device according to another aspect of the present disclosure may include an inner fixing tape 710 covering the signal cable 500 between the display panel 100 and the back cover 300, and an outer fixing tape 720 covering the signal cable 500 on the outer surface of the back cover 300.

In addition, in the display device according to another aspect of the present disclosure, the inner fixing tape 710 may be spaced apart from the back cover 300. In the display device according to another aspect of the present disclosure, deformation of the display panel 100 or distortion of the image implemented by the display panel 100 can be prevented due to the shape of the back cover 300. Accordingly, in the display device according to another aspect of the present disclosure, quality of the image implemented by the display panel 100 can also be improved.

In the display device according to the aspects of the present disclosure, the position of the penetrating hole of the back cover, through which the signal cable connecting the source printed circuit board and the control printed circuit board passes, may be adjusted to maintain a space between the display panel and the back cover in a predetermined range by the signal cable. Therefore, in the display device according to the aspects of the present disclosure, a predetermined air gap between the display panel and the back cover can be maintained regardless of the state of installing the display panel. Accordingly, in the display device according to the present disclosure, display quality from deteriorating due to residual heat can be prevented as a result.

What is claimed:

1. A display device comprising:
   a display panel including a first substrate and a second substrate;
   a source printed circuit board on the second substrate of the display panel, the source printed circuit board electrically connected to the display panel;
   a control printed circuit board electrically connected to the source printed circuit board by a signal cable;
   a back cover accommodating the display panel including the first and second substrates and the source printed circuit board, and disposed between the source printed circuit board and the control printed circuit board, the back cover including a penetrating hole, through which the signal cable passes; and
   an inner fixing tape disposed between the display panel and the back cover, and attaching the signal cable to the display panel,
   wherein the penetrating hole of the back cover is disposed at a mid-portion of the second substrate in a vertical direction, and
   wherein the inner fixing tape is disposed at proximity of the penetrating hole of the back cover.

2. The display device according to claim 1, wherein the source printed circuit board and the control printed circuit board are disposed at a lower end of the second substrate.

3. The display device according to claim 1,
   wherein the signal cable is disposed between the display panel and the inner fixing tape.

4. The display device according to claim 1, wherein the inner fixing tape includes a heat dissipating material.

5. The display device according to claim 4, wherein the inner fixing tape is disposed along the signal cable between the display panel and the back cover.

6. The display device according to claim 1, further comprising an outer fixing tape on an outer surface of the back cover,
   wherein the signal cable is disposed between the back cover and the outer fixing tape.

7. The display device according to claim 6, wherein the outer fixing tape is disposed at proximity of the penetrating hole of the back cover.

8. The display device according to claim 6, wherein the outer fixing tape includes the same material as the inner fixing tape.

9. The display device according to claim 1, wherein the first substrate has a size greater than that of the second substrate.

10. A display device comprising:
    a display panel including first and second substrates;
    a back cover accommodating the display panel including the first and second substrates and having a through-hole;
    a source printed circuit board disposed inside the back cover;
    a control printed circuit board disposed outside the back cover and connected to the source printed circuit board by the through-hole;
    a signal cable connecting the control printed circuit board and the source printed circuit board by the through-hole;
    an air gap between the display panel and the back cover; and
    a first fastener disposed in the air gap, and attaching the single cable to the display panel,
    wherein the first fastener is disposed at proximity of the through-hole of the back cover.

11. The display device according to claim 10, further comprising a second fastener outside of the back cover and securing the signal cable.

12. The display device according to claim 11, wherein the second fastener is disposed between the back cover and the signal cable.

13. The display device according to claim 11, wherein the second fastener is disposed between the signal cable and a device display case.

14. The display device according to claim 10, wherein the first fastener acts to dissipate heat from the display panel with the air gap.

15. The display device according to claim 10, wherein the hole in the back cover is disposed at proximity of a mid-portion of the back cover.

16. The display device according to claim 10, wherein the first fastener is disposed between the signal cable and the back cover.

17. The display device according to claim 10, wherein the first fastener is disposed between the display panel and the back cover.

18. The display device according to claim 10, wherein the signal cable includes a flexible flat cable or a flexible printed circuit board.

19. The display device according to claim 10, further comprising a flexible film electrically connecting the source printed circuit board and the display panel.

* * * * *